(12) United States Patent
Zhang

(10) Patent No.: US 11,917,284 B2
(45) Date of Patent: Feb. 27, 2024

(54) ELECTRONIC DEVICE AND METHOD FOR UNDER-SCREEN CAMERA PERFORMING PHOTOGRAPHING AND DISPLAY, AND COMPUTER-READABLE STORAGE MEDIUM

(71) Applicant: ZTE Corporation, Shenzhen (CN)

(72) Inventor: Xiaoliang Zhang, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 129 days.

(21) Appl. No.: 17/437,309

(22) PCT Filed: Apr. 3, 2020

(86) PCT No.: PCT/CN2020/083186
§ 371 (c)(1),
(2) Date: Sep. 8, 2021

(87) PCT Pub. No.: WO2021/017517
PCT Pub. Date: Feb. 4, 2021

(65) Prior Publication Data
US 2022/0182549 A1    Jun. 9, 2022

(30) Foreign Application Priority Data
Jul. 26, 2019   (CN) .......................... 201910682298.1

(51) Int. Cl.
*H04N 23/63*   (2023.01)
*G09G 3/20*    (2006.01)

(52) U.S. Cl.
CPC .............. *H04N 23/63* (2023.01); *G09G 3/20* (2013.01); *G09G 2320/0626* (2013.01); *G09G 2340/12* (2013.01)

(58) Field of Classification Search
CPC ........................................................ H04N 23/63
(Continued)

(56) References Cited

U.S. PATENT DOCUMENTS

| 2016/0225301 A1 | 8/2016 | Scepanovic et al. |
| 2017/0123454 A1 | 5/2017 | Evans, V et al. |

(Continued)

FOREIGN PATENT DOCUMENTS

| CN | 106850897 A | 6/2017 |
| CN | 106921767 A | 7/2017 |

(Continued)

OTHER PUBLICATIONS

The State Intellectual Property Office of People's Republic of China. First Office Action for CN Application No. 2019106822981 and English translation, dated Jul. 29, 2022, pp. 1-10.

(Continued)

*Primary Examiner* — Joel W Fosselman
(74) *Attorney, Agent, or Firm* — Vivacqua Crane, PLLC

(57) ABSTRACT

An electronic device and method for performing photographing and displaying with an under-screen camera, and a non-transitory computer-readable storage medium are disclosed. The electronic device may include a display screen, a camera, a memory and a processor, where the memory is configured to store program instructions, and the processor is configured to process the program instructions to execute following steps: generating an area with no display content within a preset area according to a screen brightness of the display screen; and synthesizing a picture of a display layer which corresponds to the area with no display content and a preview image of a photographed object that is acquired by the camera into a display image of the photographed object.

12 Claims, 8 Drawing Sheets

(58) Field of Classification Search
USPC .................................................. 348/333.11
See application file for complete search history.

(56) References Cited

U.S. PATENT DOCUMENTS

2017/0124932 A1    5/2017  Evans, V et al.
2019/0158713 A1*   5/2019  McMillan .............. H04N 23/90

FOREIGN PATENT DOCUMENTS

| CN | 108366186 A | | 8/2018 | | |
|---|---|---|---|---|---|
| CN | 109274792 | * | 9/2018 | | |
| CN | 109192123 A | | 1/2019 | | |
| CN | 109274792 A | | 1/2019 | | |
| CN | 109348123 A | | 2/2019 | | |
| CN | 109541833 A | | 3/2019 | | |
| CN | 109976021 A | | 7/2019 | | |
| TW | 201839745 A | | 11/2018 | | |
| WO | WO-2015116217 A1 | * | 8/2015 | ............. | G06F 3/005 |

OTHER PUBLICATIONS

The State Intellectual Property Office of People's Republic of China. First Search Report for CN Application No. 2019106822981 and English translation, dated Jul. 25, 2022, pp. 1-6.
European Patent Office, Supplementary European Search Report for EP Application No. 20848380.0, dated Feb. 22, 2022, pp. 1-8.
International Searching Authority. International Search Report and Written Opinion for PCT Application No. PCT/CN2020/083186 and English translation, dated Jun. 24, 2020, pp. 1-9.

* cited by examiner

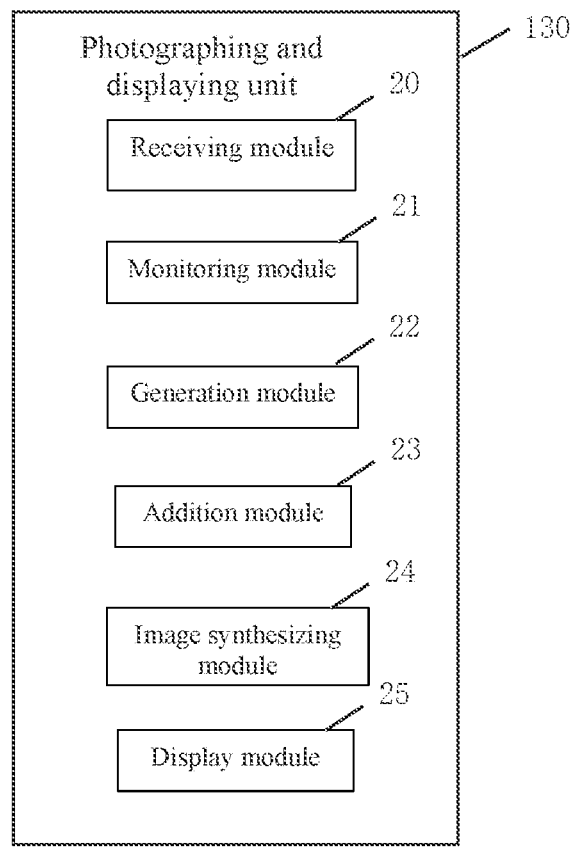
Fig. 2
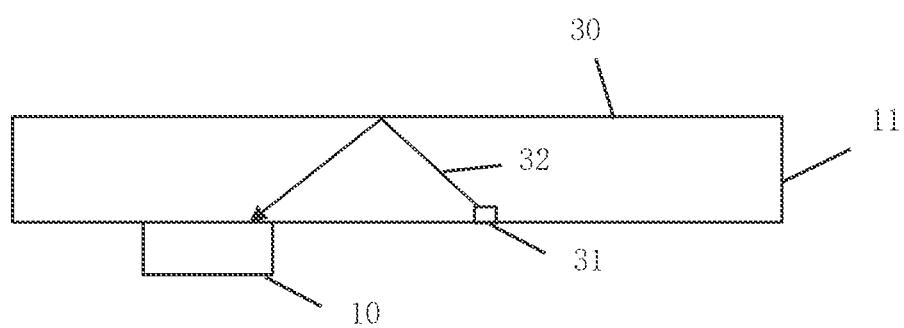
Fig. 3-a

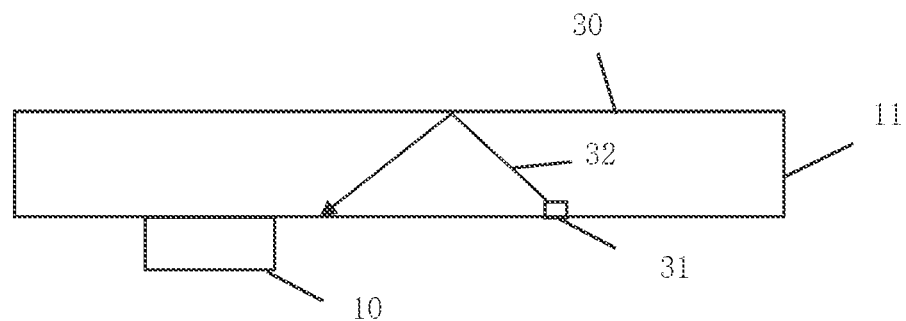
Fig. 3-b
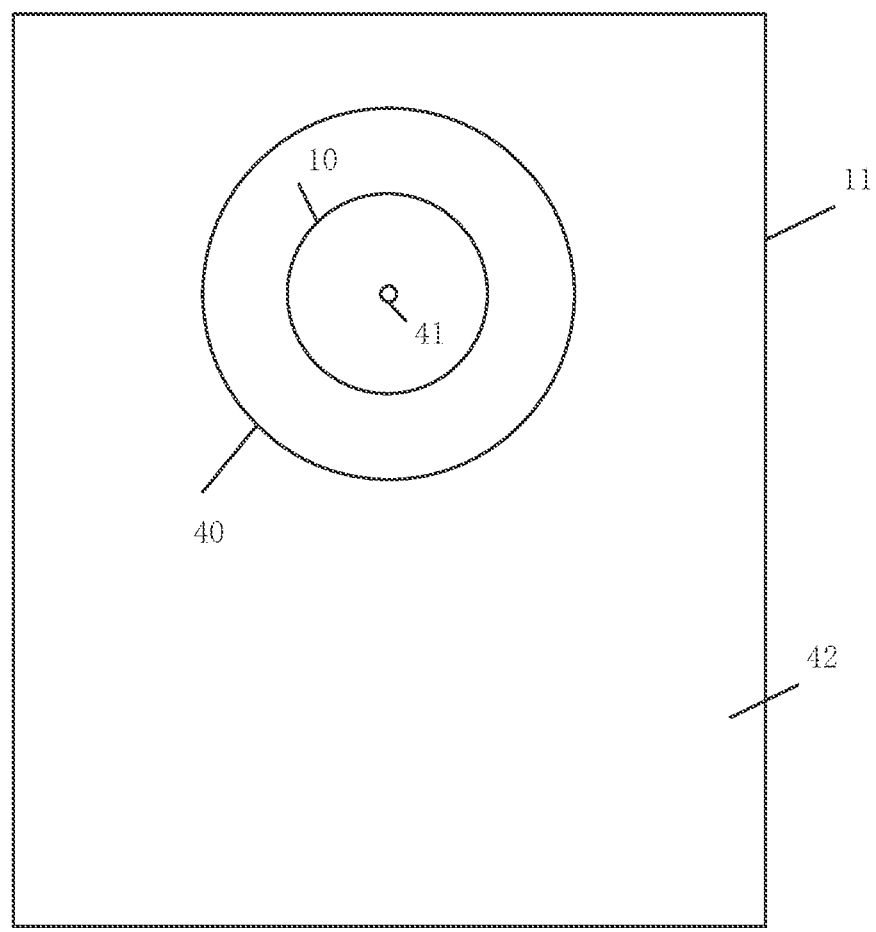
Fig. 4-a

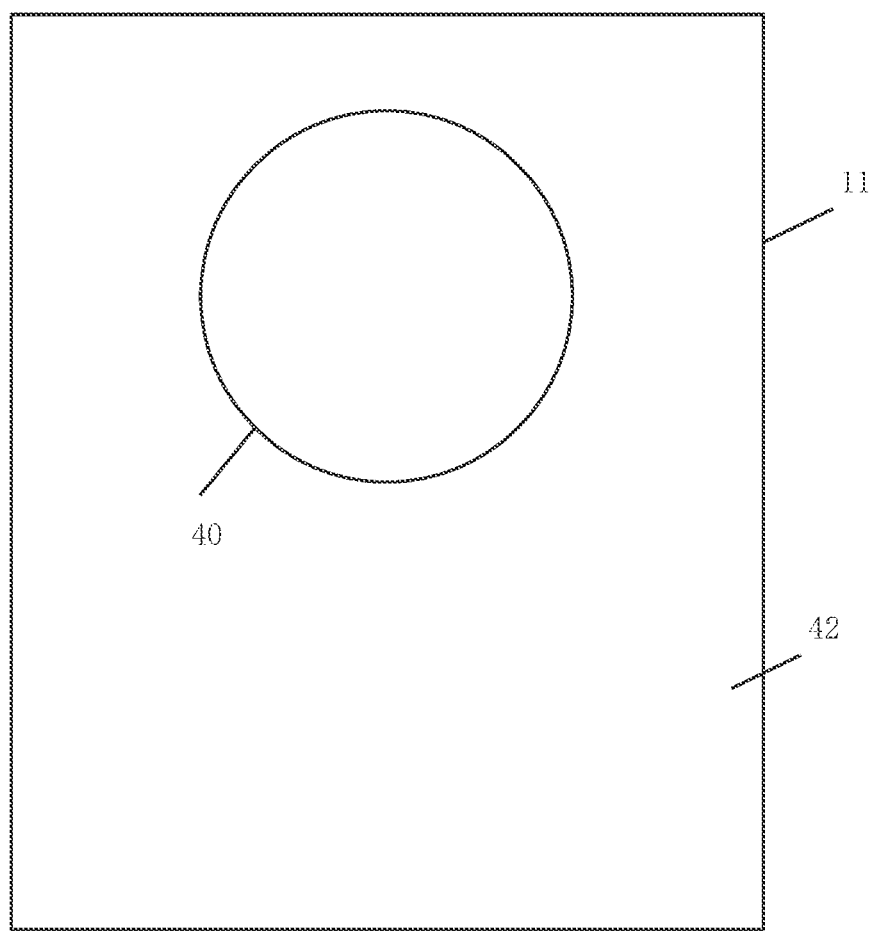
Fig. 4-b

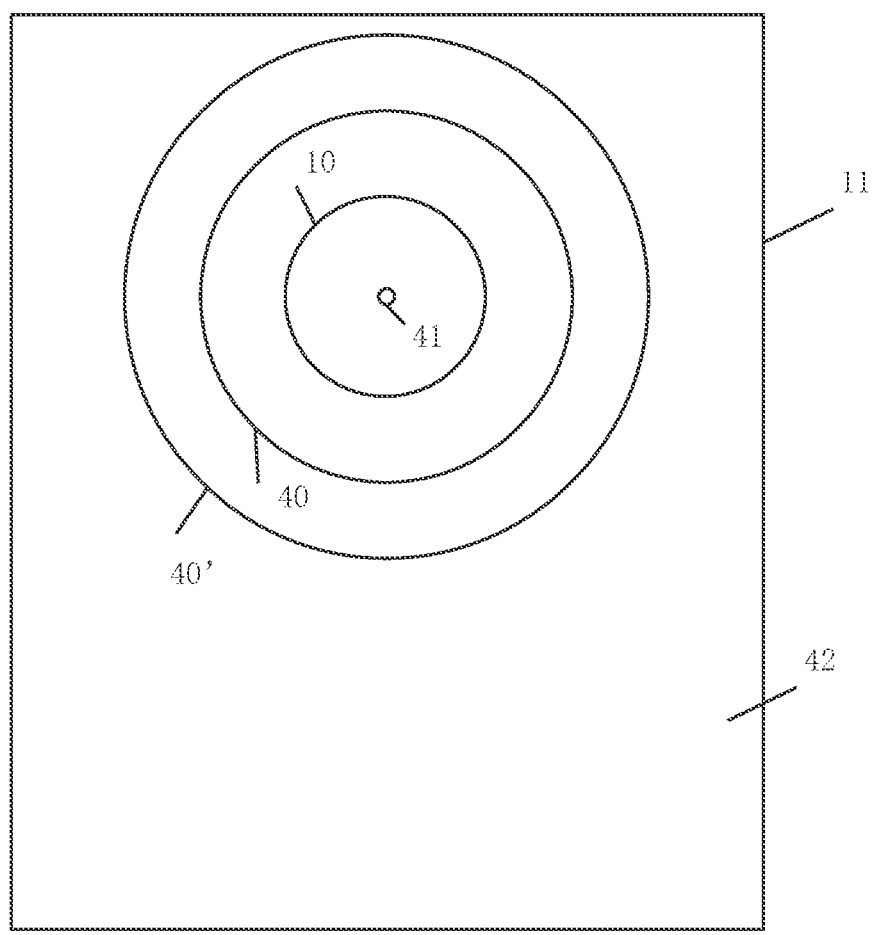
Fig. 4-c

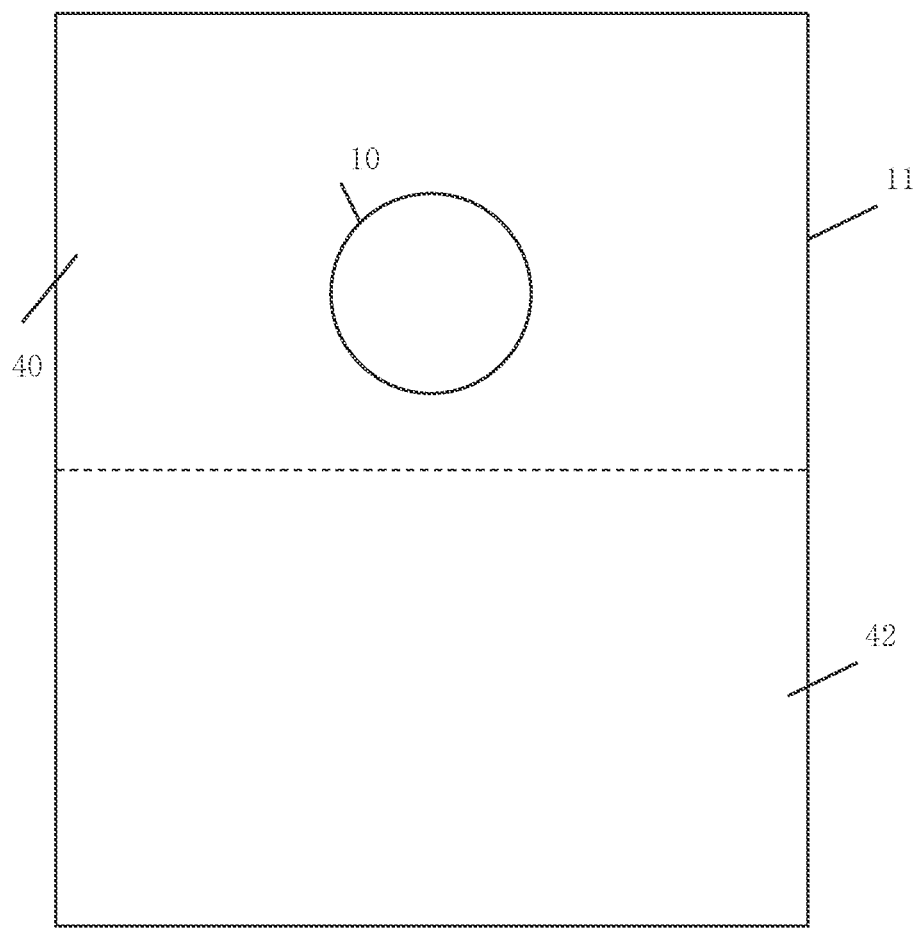
Fig. 4-d

ELECTRONIC DEVICE AND METHOD FOR UNDER-SCREEN CAMERA PERFORMING PHOTOGRAPHING AND DISPLAY, AND COMPUTER-READABLE STORAGE MEDIUM

CROSS-REFERENCE TO RELATED APPLICATION

This application is a national stage filing under 35 U.S.C. § 371 of international application number PCT/CN2020/083186, filed Apr. 3, 2020, which claims priority to Chinese patent application No. 201910682298.1, filed on Jul. 26, 2019. The contents of these applications are incorporated herein by reference in their entirety.

TECHNICAL FIELD

The present disclosure relates to the related technology of performing photographing and displaying with an under-screen camera, in particular to an electronic device and method for performing photographing and displaying with an under-screen camera, and a non-transitory computer-readable storage medium.

BACKGROUND

With the development of mobile intelligent terminals, the technology of the screens of mobile phones has become increasingly mature. Also, a wave of full-screen phones has been set off in the mobile phone market in recent years. In order to increase the screen-to-body ratio of a display screen of a mobile phone, the arrangement of a front camera of the mobile phone is a key issue. In the existing products and technical schemes, there are also many design schemes found intended to increase the screen-to-body ratio of mobile phones, for example, by reducing the width of the forehead of a mobile phone, applying a pop-up camera, etc.

SUMMARY

The present disclosure provides an electronic device and method for performing photographing and displaying with an under-screen camera, and a non-transitory computer-readable storage medium, to enable a mobile phone to automatically adjust the size of an area with no display content around the camera according to the screen brightness when a user takes a picture with the mobile phone.

In an embodiment, the present disclosure provides an electronic device which may include a display screen, a camera, a memory and a processor, where program instructions are stored in the memory, and the processor is configured to process the program instructions to implement the following steps:

generating an area with no display content within a preset area according to a screen brightness of the display screen; and synthesizing a picture of a display layer which corresponds to the area with no display content and a preview image of a photographed object that is acquired by the camera into a display image of the photographed object.

In another embodiment, the present disclosure provides a method for performing photographing and displaying with an under-screen camera. The method may include:

generating an area with no display content within a preset area according to a screen brightness of the display screen; and synthesizing a picture of a display layer which corresponds to the area with no display content and a preview image of a photographed object that is acquired by the camera into a display image of the photographed object.

In yet another embodiment, the present disclosure provides a non-transitory computer-readable storage medium storing a computer program which, when executed by a processor, causes the processor to implement the method for performing photographing and displaying with an under-screen camera as described above.

BRIEF DESCRIPTION OF DRAWINGS

The accompanying drawings are used to provide a further understanding of the technical schemes of the present disclosure and constitute a part of the description. The accompanying drawings are used to explain the technical schemes of the present disclosure together with the embodiments of the present disclosure and do not constitute a restriction on the technical schemes of the present disclosure.

FIG. 2 is a diagram of functional modules of a unit for performing photographing and displaying with an under-screen camera according to a second exemplary embodiment of the present disclosure;

FIG. 3-$a$ is a schematic diagram of light rays emitted by screen display pixels, which constitute noise light rays affecting photographing and imaging of a camera, according to the second exemplary embodiment of the present disclosure;

FIG. 3-$b$ is a schematic diagram of light rays emitted by screen display pixels, which do not constitute noise light rays affecting photographing and imaging of a camera, according to the second exemplary embodiment of the present disclosure;

FIG. 4-$a$ is a schematic diagram of an area with no display content of a display screen according to the second exemplary embodiment of the present disclosure;

FIG. 4-$b$ is a schematic diagram of adding a display layer to a photographing preview interface of the display screen according to the second exemplary embodiment of the present disclosure;

FIG. 4-$c$ is a schematic diagram of a changeable area with no display content of the display screen according to the second exemplary embodiment of the present disclosure;

FIG. 4-$d$ is a schematic diagram of a fixed area with no display content of the display screen according to the second exemplary embodiment of the present disclosure;

DETAILED DESCRIPTION

In order to make the technical schemes and advantages of the present disclosure clear, the present disclosure will be further described in detail with reference to the accompanying drawings and by way of example. It should be noted that any combinations of embodiments and features of the embodiments of the present disclosure without conflict are possible.

Figure 1:
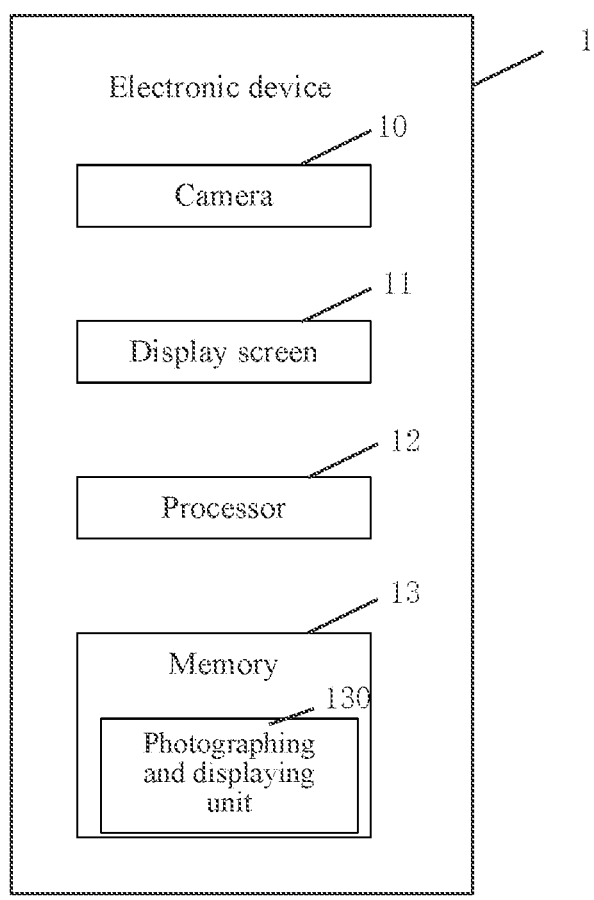
FIG. 1 is a hardware architecture diagram of an electronic device for performing photographing and displaying with an under-screen camera according to a first exemplary embodiment of the present disclosure.

A hardware architecture diagram of an electronic device 1 provided by an embodiment of the present disclosure is shown in FIG. 1. The electronic device 1 may be a mobile phone, a tablet, a computer, etc. As shown in FIG. 1, the electronic device 1 includes a camera 10 and a display screen 11. There may be one or more cameras 10 provided. In this embodiment, an electronic device 1 including only one camera 10 is taken as an example to explain the present disclosure. The camera 10 is configured to acquire preview image data of a photographed object. When the camera 10 is in a photographing state, external light rays may enter the camera 10 through the display screen 11, so as to image the photographed object. The camera 10 is provided under the display screen 11 and parallel to the display screen 11. There may be a certain distance between the camera 10 and the display screen 11, or they may be closely attached to each other. In this embodiment, the display screen 11 may be a transparent display screen, including but not limited to an active-matrix organic light emitting diode (AMOLED) display screen. An area with no display content and a normal area with display contents are displayed on the display screen 11 when the camera 10 is in a photographing state, or the area with no display content of the display screen 11 is displayed as a normal area with display contents when the camera 10 is not in the photographing state. The electronic device 1 further includes a processor 12 and a memory 13. The memory 13 may be configured to store computer programs, for example, software programs and modules of application software. For example, in the embodiment of the present disclosure, the memory 13 stores a photographing and displaying unit 130. The photographing and displaying unit 130 processes a computer program corresponding to a method for performing photographing and displaying with an under-screen camera for the electronic device 1. The processor 12 runs the computer program stored in the memory 13 to perform various functional applications and data processing, that is, to implement the method as described above. The memory 13 may include a high-speed random access memory, and may also include a non-volatile memory, such as one or more magnetic storage apparatuses, a flash memory, or other non-volatile solid-state memories. In some examples, the memory 13 may include memories remotely located with respect to the processor 12, and these remote memories may be connected to the electronic device 1 through a network. Examples of the above-mentioned network include the Internet, an intranet, a local area network, a mobile communication network, and a combination thereof. The photographing and displaying unit 130 is configured to generate an area with no display content according to a screen brightness of the display screen 11, so as to synthesize a picture of a display layer which corresponds to the area with no display content and a preview image of a photographed object that is acquired by the camera 10 into a display image of the photographed object, and display the display image on the display screen 11.

A diagram of functional modules of a photographing and displaying unit 130 of an embodiment of the present disclosure is shown in FIG. 2. The photographing and displaying unit 130 includes the following modules.

A receiving module 20 is configured to receive the preview image of the photographed object that is acquired by the camera 10. When the camera 10 is in the photographing state, external light rays may enter a lens of the camera 10 through the display screen 11 to image the photographed object. After light is emitted from screen display pixels of the display screen 11, some of the emitted light rays are reflected by a glass cover plate of the display screen 11, and the reflected light rays will enter the lens of the camera 10 and become noise light rays of the camera 10. The intensity of the noise light rays decreases as the distance between the light-emitting screen display pixels and the lens of the camera 10 increases, until the light rays will no longer become the noise light rays affecting the imaging quality of the camera 10. As shown in FIG. 3-*a*, when the screen display pixels 31 emit light, some of the light rays 32 emitted thereby are reflected into the lens of the camera 10 through the glass cover plate 30 of the display screen 11, and become noise light rays affecting the imaging quality of the camera 10. As shown in FIG. 3-*b*, when the screen display pixels 31 emit light and some of the light rays 32 emitted thereby are not reflected into the lens of the camera 10 through the glass cover plate 30 of the display screen 11, the emitted light rays 32 do not constitute noise light rays affecting the imaging quality of the camera 10.

A monitoring module 21 is configured to monitor a magnitude of electric current supplied to the display screen 11, so as determine the screen brightness of the display screen 11 according to the magnitude of the electric current. The magnitude of the electric current supplied to the display screen 11 is directly proportional to the screen brightness of the display screen 11. The larger the magnitude of the electric current supplied to the display screen 11, the higher the screen brightness of the display screen 11. The smaller the magnitude of the electric current supplied to the display screen 11, the lower the screen brightness of the display screen 11.

A generation module 22 is configured to generate an area with no display content within a preset area according to the screen brightness of the display screen 11. The preset area is an area preset by a manufacturer when the electronic device 1 leaves the factory. Alternatively, the preset area may also be an area determined according to user selection. The area with no display content may be of any shape, such as a circle or a rectangle, which is not limited here. In this embodiment, taking a circular area with no display content as an example, as shown in FIG. 4-*a*, there is a circular area 40 with no display content on the display screen 11, and the area 40 with no display content is centered on a center 41 of the lens of the camera 10. As shown in FIG. 4-*c*, there are two circles with different radii on the display screen 11, both of which are centered on the center 41 of the lens of the camera 10. When the camera 10 is in the photographing state, an area inside the circle is the area with no display content. When the screen brightness of the display screen 11 is lower, the area with no display content is the inner circle 40. When the screen brightness of the display screen 11 is higher, the area with no display content is the outer circle 40'. The circle radius of the area with no display content increases with the increase of the screen brightness of the display screen 11, that is, the range of the area with no display content can be adjusted according to the screen brightness of the display screen 11. In this embodiment, a certain threshold may also be set for the area 40 with no display content. When the circle radius of the area 40 with no display content reaches a certain threshold, the circle radius of the area 40 with no display content will no longer increase with the increase of the screen brightness of the display screen 11.

In another embodiment, the area 40 with no display content may also be a fixed area around the camera 10, and the area of the area 40 with no display content does not change when the screen brightness of the display screen 11 has changed. The area 40 with no display content may be of any shape, which is not limited here. In this embodiment, a rectangular area 40 with no display content is taken as an example. As shown in FIG. 4-d, the area 40 with no display content is a rectangular area in the upper half of the display screen 11, and the area of the rectangular area does not change when the screen brightness of the display screen 11 has changed, while the remaining area of the display screen 11 is a normal area 42 with display contents.

When the camera 10 is in the photographing state, the display screen 11 is in the form of a photographing preview interface. An addition module 23 is configured to add a display layer which corresponds to the area 40 with no display content to the photographing preview interface. The display layer is a picture generated according to the screen brightness of the display screen 11, and the picture of the display layer may be of any shape, such as a circle or a rectangle. The picture of the display layer is configured to overlay the preview image of the photographed object that corresponds to the area with no display content 40. The picture of the display layer which corresponds to the area 40 with no display content and the preview image of the photographed object that is acquired by the camera 10 are synthesized into a display image of the photographed object. Here, there are no restrictions on the display pixels of the display layer, as long as, when the camera 10 is in the photographing state, external light rays can enter the camera 10 through the display screen 11 so as to image the photographed object. As shown in FIG. 4-b, when the camera 10 is in the photographing state, the display screen 11 is in the form of the photographing preview interface, and a display layer corresponding to the area 40 with no display content is added to the photographing preview interface. The display layer is a circular picture with a certain radius generated according to the screen brightness of the display screen 11. The circular picture of the display layer is configured to overlay the preview image of the photographed object that corresponds to the area with no display content 40. The display pixels (R, G, B) of all pixels on the circular picture of the display layer are (0, 0, 0), that is, the circular picture of the display layer is a black circular picture, and the area where the black circular picture is located is the area 40 with no display content. Since the display pixels (R, G, B) of all the pixels on the black circular picture are (0, 0, 0), when the display screen 11 is in the form of the photographing preview interface, the area 40 with no display content is a transparent area with no display content, and the remaining area of the display screen 11 is a normal area 42 with display contents in which there are display contents, as shown in FIG. 4-a. When the camera 10 is not in the photographing state, the display screen 11 is not in the form of the photographing preview interface, the area 40 with no display content is filled with display contents and becomes a non-transparent area, and the whole screen of the display screen 11 is normally displayed with no circular transparent area.

An image synthesizing module 24 is configured to synthesize the picture of the display layer which corresponds to the area 40 with no display content and the preview image of the photographed object that is acquired by the camera 10 into a display image of the photographed object.

A display module 25 is configured to send the display image to the display screen 11 for display. The display image is an image presented when the display screen 11 is in the form of the photographing preview interface. As shown in FIG. 4-a, when the display screen 11 is in the form of the photographing preview interface, the display screen 11 displays the area 40 with no display content and the normal area 42 with display contents. The area 40 with no display content is a transparent area with no display content, and the normal area 42 with display contents is a non-transparent area with display contents.

Figure 5:
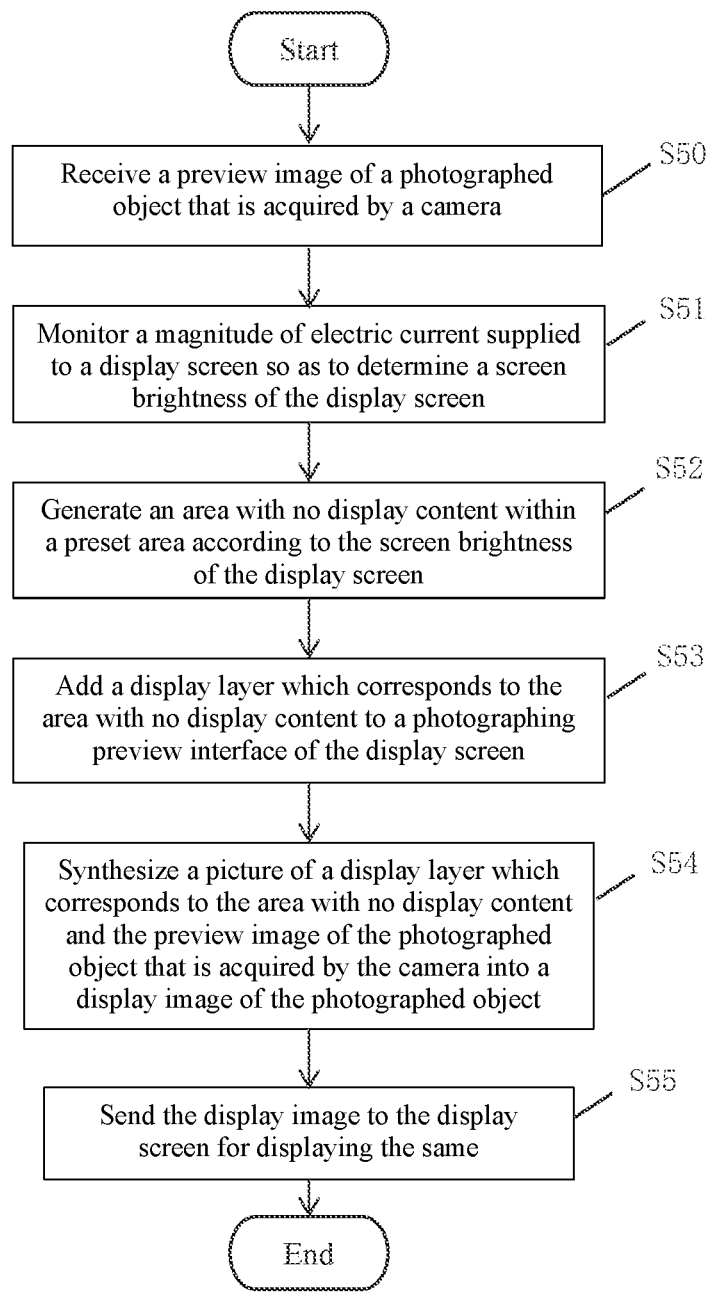
FIG. 5 is a flowchart of a method for performing photographing and displaying with an under-screen camera according to a third exemplary embodiment of the present disclosure.

A flowchart of a method of performing photographing and displaying with an under-screen camera for the electronic device 1 in an embodiment of the present disclosure is shown in FIG. 5.

At step S50, a receiving module 20 receives a preview image of a photographed object that is acquired by the camera 10. When the camera 10 is in the photographing state, external light rays may enter a lens of the camera 10 through the display screen 11 to image the photographed object. After light is emitted from screen display pixels of the display screen 11, some of the emitted light rays are reflected by a glass cover plate of the display screen 11, and the reflected light rays will enter the lens of the camera 10 and become noise light rays of the camera 10. The intensity of the noise light rays decreases as the distance between the light-emitting screen display pixels and the lens of the camera 10 increases, until the light rays will no longer become the noise light rays affecting the imaging quality of the camera 10. As shown in FIG. 3-a, when the screen display pixels 31 emit light, some of the light rays 32 emitted thereby are reflected into the lens of the camera 10 through the glass cover plate 30 of the display screen 11, and become noise light rays affecting the imaging quality of the camera 10. As shown in FIG. 3-b, when the screen display pixels 31 emit light and some of the light rays 32 emitted thereby are not reflected into the lens of the camera 10 through the glass cover plate 30 of the display screen 11, the emitted light rays 32 do not constitute noise light rays affecting the imaging quality of the camera 10.

At step S51, a monitoring module 21 monitors a magnitude of electric current supplied to the display screen 11, so as to determine the screen brightness of the display screen 11 according to the magnitude of the electric current. The magnitude of the electric current supplied to the display screen 11 is directly proportional to the screen brightness of the display screen 11. The larger the magnitude of the electric current supplied to the display screen 11, the higher the screen brightness of the display screen 11. The smaller the magnitude of the electric current supplied to the display screen 11, the lower the screen brightness of the display screen 11.

At step S52, a generation module 22 generates an area with no display content within a preset area according to the screen brightness of the display screen 11. The preset area is an area preset by a manufacturer when the electronic device 1 leaves the factory. Alternatively, the preset area may also be an area determined according to user selection. The area with no display content may be of any shape, such as a circle or a rectangle, which is not limited here. In this embodiment, taking a circular area with no display content as an example, as shown in FIG. 4-a, there is a circular area 40 with no display content on the display screen 11, and the area 40 with no display content is centered on a center 41 of the lens of the camera 10. As shown in FIG. 4-c, there are two circles with different radii on the display screen 11, both of which are centered on the center 41 of the lens of the camera 10. When the camera 10 is in the photographing state, an area inside the circle is the area with no display content. When the screen brightness of the display screen 11 is lower, the area with no display content is the inner circle 40. When the screen brightness of the display screen 11 is higher, the area with no display content is the outer circle 40'. The circle radius of the area with no display content increases with the increase of the screen brightness of the display screen 11, that is, the range of the area with no display content can be adjusted according to the screen brightness of the display screen 11. In this embodiment, a certain threshold may also be set for the area 40 with no display content. When the circle radius of the area 40 with no display content reaches a certain threshold, the circle radius of the area 40 with no display content will no longer increase with the increase of the screen brightness of the display screen 11.

In another embodiment, the area 40 with no display content may also be a fixed area around the camera 10, and the area of the area 40 with no display content does not change when the screen brightness of the display screen 11 has changed. The area 40 with no display content may be of any shape, which is not limited here. In this embodiment, a rectangular area 40 with no display content is taken as an example. As shown in FIG. 4-*d*, the area 40 with no display content is a rectangular area in the upper half of the display screen 11, and the area of the rectangular area does not change when the screen brightness of the display screen 11 has changed, while the remaining area of the display screen 11 is a normal area 42 with display contents.

At step S53, when the camera 10 is in the photographing state, the display screen 11 is in the form of a photographing preview interface. An addition module 23 adds a display layer which corresponds to the area 40 with no display content to the photographing preview interface. The display layer is a picture generated according to the screen brightness of the display screen 11, and the picture of the display layer may be of any shape, such as a circle or a rectangle. The picture of the display layer is configured to overlay the preview image of the photographed object that corresponds to the area with no display content 40. The picture of the display layer which corresponds to the area 40 with no display content and the preview image of the photographed object that is acquired by the camera 10 are synthesized into a display image of the photographed object. Here, there are no restrictions on the display pixels of the display layer, as long as, when the camera 10 is in the photographing state, external light rays can enter the camera 10 through the display screen 11 so as to image the photographed object. As shown in FIG. 4-*b*, when the camera 10 is in the photographing state, the display screen 11 is in the form of the photographing preview interface, and a display layer corresponding to the area 40 with no display content is added to the photographing preview interface. The display layer is a circular picture with a certain radius generated according to the screen brightness of the display screen 11. The circular picture of the display layer is configured to overlay the preview image of the photographed object that corresponds to the area with no display content 40. The display pixels (R, G, B) of all pixels on the circular picture of the display layer are (0, 0, 0), that is, the circular picture of the display layer is a black circular picture, and the area where the black circular picture is located is the area 40 with no display content. Since the display pixels (R, G, B) of all the pixels on the black circular picture are (0, 0, 0), when the display screen 11 is in the form of the photographing preview interface, the area 40 with no display content is a transparent area with no display content, and the remaining area of the display screen 11 is a normal area 42 with display contents in which there are display contents, as shown in FIG. 4-*a*. When the camera 10 is not in the photographing state, the display screen 11 is not in the form of the photographing preview interface, the area 40 with no display content is filled with display contents and becomes a non-transparent area, and the whole screen of the display screen 11 is normally displayed with no circular transparent area.

At step S54, an image synthesizing module 24 synthesizes the picture of the display layer which corresponds to the area 40 with no display content and the preview image of the photographed object that is acquired by the camera 10 into a display image of the photographed object.

At step S55, a display module 25 sends the display image to the display screen 11 for display. The display image is an image presented when the display screen 11 is in the form of the photographing preview interface. As shown in FIG. 4-*a*, when the display screen 11 is in the form of the photographing preview interface, the display screen 11 displays the area 40 with no display content and the normal area 42 with display contents. The area 40 with no display content is a transparent area with no display content, and the normal area 42 with display contents is a non-transparent area with display contents.

Figure 6:
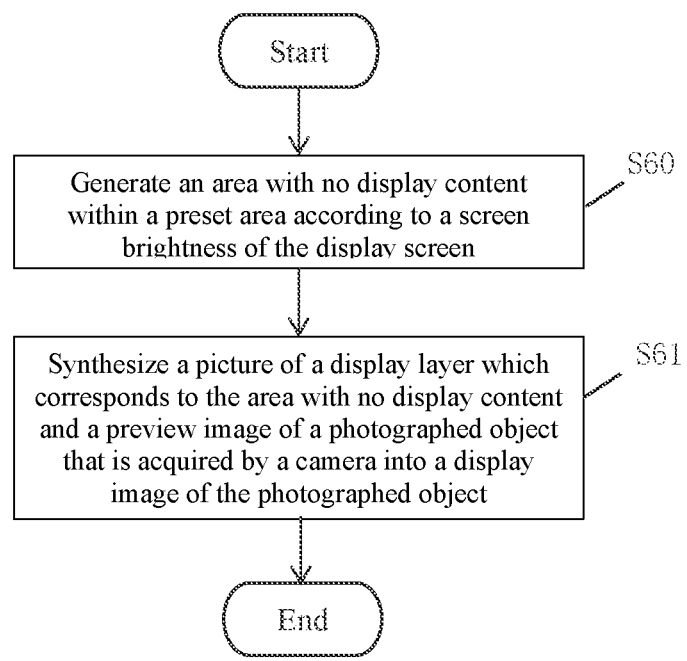
FIG. 6 is a flowchart of a method for performing photographing and displaying with an under-screen camera according to a fourth exemplary embodiment of the present disclosure.

A flowchart of a method of performing photographing and displaying with an under-screen camera for the electronic device 1 in an embodiment of the present disclosure is shown in FIG. 6.

At step S60, an area 40 with no display content is generated within a preset area according to a screen brightness of the display screen 11.

At step S61, a picture of a display layer which corresponds to the area 40 without display content and a preview image of a photographed object that is acquired by the camera 10 are synthesized into a display image of the photographed object.

In another embodiment, a computer program is stored in a non-transitory computer-readable storage medium, where the computer program is configured to implement the method for performing photographing and displaying with an under-screen camera as described above when the computer program is executed, for example, by a processor.

According to the technical schemes of the present disclosure, by means of generating an area with no display content within a preset area according to a screen brightness of a display screen, and synthesizing a picture of a display layer which corresponds to the area without display content and a preview image of a photographed object that is acquired by the camera into a display image of the photographed object, when an electronic device enters a photographing state, the area with no display content around the camera can be automatically adjusted according to the screen brightness of the display screen, thereby reducing light noise caused by screen pixels of the display screen and improving the imaging effect when the under-screen camera takes a picture.

While the embodiments disclosed in the present disclosure are described above, these embodiments are only for facilitating understanding of the present disclosure and are not used for limiting the present disclosure. Those having ordinary skills in the art can make any modification and change in the implementations and details without departing from the principal and scope of the present disclosure, but the scope of protection of the present disclosure shall still be subject to the scope defined by the appended claims.

The invention claimed is:

1. An electronic device, comprising a display screen, a camera, a memory and a processor, wherein the camera is provided under the display screen, the memory is configured to store program instructions, and the processor is configured to process the program instructions to execute the following steps:

determining a first area and a second area in the display screen, wherein the first area surrounds the camera around a center of the camera, and the second area is remaining area except the first region in the display screen;

determining a preset area in the display screen, wherein the first area is located within the preset area;

adjusting the size of the first area according to the screen brightness of the display screen, wherein the size of the first area is increased with the increase of the screen brightness of the display screen within the preset area;

when the camera is in the photographing state, the first area doesn't display content while the second area displays content;

when the camera is not in the photographing state, both the first area and the second area di splays content.

2. The electronic device of claim 1, wherein the screen brightness of the display screen is directly proportional to a magnitude of electric current supplied to the display screen.

3. The electronic device of claim 1, wherein the first area is a circle shape or a rectangle shape.

4. A method for performing photographing and displaying with an under-screen camera, comprising:

determining a first area and a second area in the display screen, wherein the first area surrounds the camera around a center of the camera, and the second area is remaining area except the first region in the display screen;

determining a preset area in the display screen, wherein the first area is located within the preset area;

adjusting the size of the first area according to the screen brightness of the display screen, wherein the size of the first area is increased with the increase of the screen brightness of the display screen within the preset area;

when the camera is in the photographing state, the first area doesn't display content while the second area displays content;

when the camera is not in the photographing state, both the first area and the second area di splays content.

5. The method for performing photographing and displaying with an under-screen camera of claim 4, wherein the screen brightness of the display screen is directly proportional to a magnitude of electric current supplied to the display screen.

6. A non-transitory computer-readable storage medium storing a computer program which, when executed by a processor, causes the processor to implement the method for performing photographing and displaying with an under-screen camera of claim 5.

7. A non-transitory computer-readable storage medium storing a computer program which, when executed by a processor, causes the processor to implement the method for performing photographing and displaying with an under-screen camera of claim 4.

8. The method for performing photographing and displaying with an under-screen camera of claim 4, wherein the first area is a circle shape or a rectangle shape.

9. A non-transitory computer-readable storage medium storing a computer program which, when executed by a processor, causes the processor to implement the method for performing photographing and displaying with an under-screen camera of claim 8.

10. An electronic device, comprising a display screen, a camera, a memory and a processor, wherein the camera is provided under the display screen, the memory is configured to store program instructions, and the processor is configured to process the program instructions to execute the following steps:

determining a first area and a second area in the display screen, wherein the first area surrounds the camera around a center of the camera, and the second area is remaining area except the first region in the display screen;

adjusting the size of the first area according to the screen brightness of the display screen, wherein the size of the first area is increased with the increase of the screen brightness of the display screen within a threshold;

when the camera is in the photographing state, the first area doesn't display content while the second area displays content;

when the camera is not in the photographing state, both the first area and the second area di splays content.

11. The electronic device of claim 10, wherein the screen brightness of the display screen is directly proportional to a magnitude of electric current supplied to the display screen.

12. The electronic device of claim 10, wherein the first area is a circle shape or a rectangle shape.

* * * * *